US005831347A

United States Patent [19]

Landis et al.

[11] Patent Number: 5,831,347

[45] Date of Patent: Nov. 3, 1998

[54] APPARATUS FOR DETERMINING IF THE DURATION OF A POWER FAILURE EXCEEDED PREDETERMINED LIMITS

[75] Inventors: Michael David Landis, Fishers; Gabriel Alfred Edde; David Michael Browning, both of Indianapolis, all of Ind.

[73] Assignee: Thomson Consumer Electronics, Inc., Indianapolis, Ind.

[21] Appl. No.: 899,966

[22] Filed: Jul. 24, 1997

Related U.S. Application Data

[63] Continuation of Ser. No. 728,504, Oct. 9, 1996, abandoned.

[51] Int. Cl.[6] .................................................... G11C 14/00

[52] U.S. Cl. ............................ 307/64; 327/143; 365/228; 365/229; 395/182.2; 395/182.12

[58] Field of Search .............................. 307/64; 348/730; 395/182.2, 182.12; 364/483, 273–273.5; 327/143, 392; 365/228, 229

[56] References Cited

U.S. PATENT DOCUMENTS

| | | | |
|---|---|---|---|
| 4,260,907 | 4/1981 | Winebarger | 327/392 |
| 4,323,987 | 4/1982 | Holtz et al. | 365/229 |
| 4,367,422 | 1/1983 | Leslie | 327/143 |
| 4,763,333 | 8/1988 | Byrd | 395/182.2 |
| 4,999,575 | 3/1991 | Germer | 324/142 |
| 5,406,272 | 4/1995 | Jang | 365/228 |

FOREIGN PATENT DOCUMENTS

| | | | |
|---|---|---|---|
| 0467578A2 | 1/1992 | European Pat. Off. | H04N 5/63 |
| 0573919A2 | 12/1993 | European Pat. Off. | H04N 5/44 |
| 4088769 | 3/1992 | Japan | H04N 5/63 |

*Primary Examiner*—William M. Shoop, Jr.
*Assistant Examiner*—Albert W. Paladini
*Attorney, Agent, or Firm*—Joseph S. Tripoli; Peter M. Emanuel; Paul P. Kiel

[57] ABSTRACT

In an electronic instrument subject to power line interruptions and having a standby power supply, an external timer is used to time a predetermined brief period (e.g. 15 seconds to 1 minute). If the timer has not yet expired when standby power is once again developed, then a controller will cause a real time clock to start timing, using the currently held time of day. If the timer has expired when standby power is once again developed, the controller will cause the time of day clock to indicate that its time is no longer accurate. Moreover, if the timer has expired, then the controller will not cause the receiver to be turned on. If the timer has not expired, then the controller will determine if the receiver was turned on when the AC power line failure occurred, and if so, the controller will cause the receiver to turn on. If the receiver was turned off when the AC power line failure occurred, then the controller will cause the receiver to remain in standby mode. If, however, a reset was caused by an extremely fast phenomenon, such as a kine arc, then the receiver would not have had time to store status bytes. Upon waking up, the receiver would note that it was inoperative for only a short time, and that certain functions, such as degaussing need not be performed.

5 Claims, 2 Drawing Sheets

APPARATUS FOR DETERMINING IF THE DURATION OF A POWER FAILURE EXCEEDED PREDETERMINED LIMITS

This application is a continuation of abandoned application Ser. No. 08/728,504 filed Oct. 9, 1996.

FIELD OF THE INVENTION

The subject invention concerns reset circuitry for electronics equipment, such as, television receivers.

BACKGROUND OF THE INVENTION

The design of modern television receivers increasingly involves the use of digitally controlled chips (i.e., integrated circuits) for control of many different functions, such as, picture processing, picture-in picture (PIP) processing, and audio processing. These chips are connected to a controller (which may be a microprocessor, a microcomputer, or a dedicated control IC) via a communications bus. The controller is responsible for writing control parameters to the chips and reading status information from the chips.

It is possible for a television receiver to store data indicating whether or not the receiver is turned on. After an AC power line failure, the receiver can use this stored data to determine if it was on when the power failure occurred and automatically turn itself on again. Unfortunately, it is not always desirable for the controller to turn the receiver back on after an AC power line failure, for example, where the power failure has lasted several hours and the receiver would turn on in the middle of the night, perhaps at a loud volume setting.

Moreover, in television receivers equipped with a real time clock, there is no way for the controller to determine how long the power was interrupted.

SUMMARY OF THE INVENTION

It is herein recognized that an external timer can be used to time a predetermined brief period (e.g. between 15 seconds and 1 minute). If the timer has not yet expired when standby power is once again developed, then the controller will cause a real time clock unit to start timing, using the currently-held time of day. If the timer has expired when standby power is once again developed, the controller will cause the time of day clock to indicate that its time is no longer accurate. Moreover, if the timer has expired, then the controller will not cause the receiver to be turned on. If the timer has not expired, then the controller will determine if the receiver was turned on when the AC power line failure occurred, and if so, the controller will cause the receiver to turn on. If the receiver was turned off when the AC power line failure occurred, then the controller will cause the receiver to remain in standby mode.

If, however, a reset was caused by an extremely fast phenomenon, such as a kine arc, then the receiver would not have had time to store status bytes. Upon waking up, the receiver would note that it was inoperative for only a short time, and that certain functions, such as degaussing need not be performed.

DETAILED DESCRIPTION OF THE EMBODIMENTS

Figure 1:
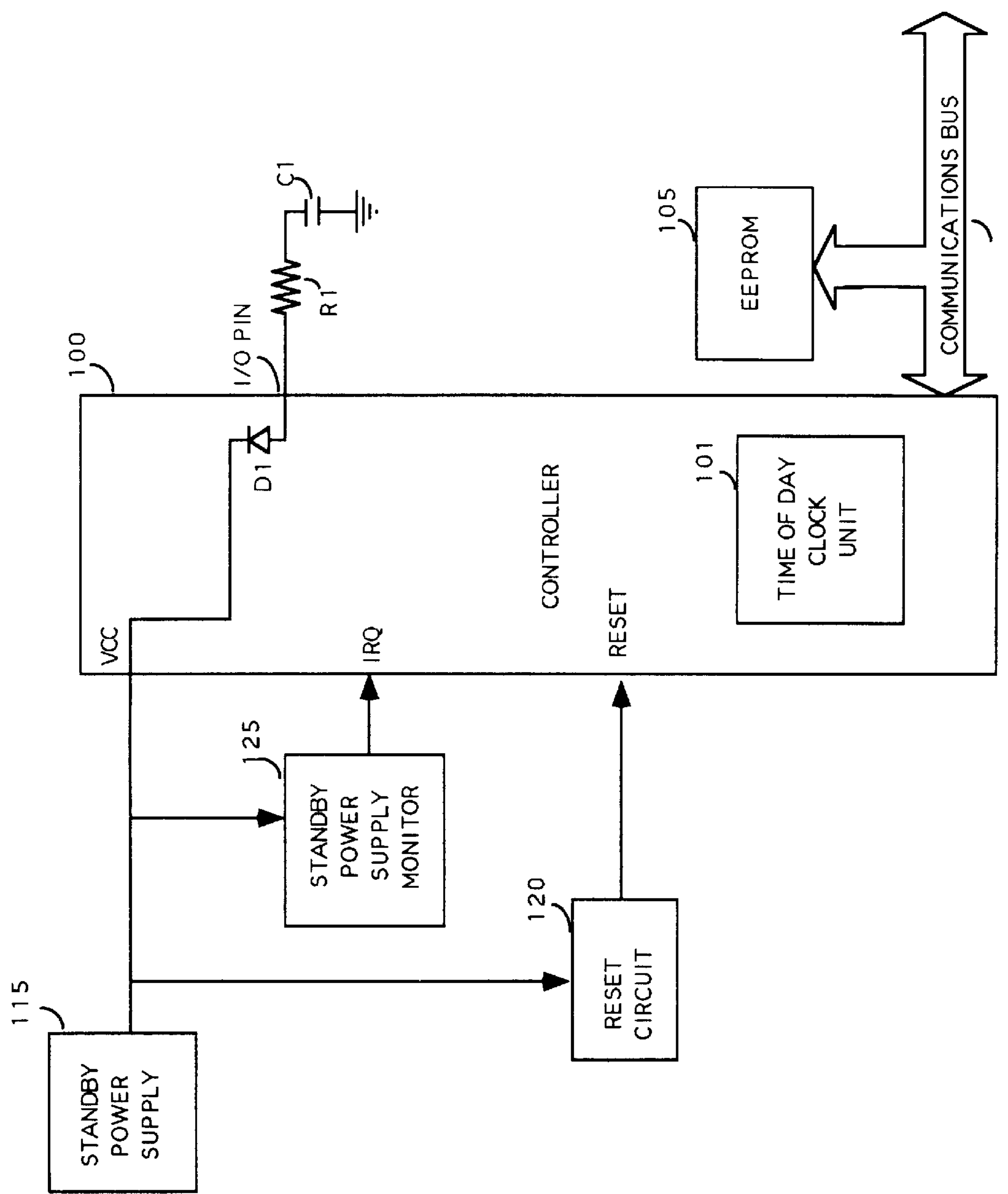
FIG. 1 shows, in block diagram form, an electronic instrument in accordance with the invention.

The electronics instrument of FIG. 1 may be, for example, a television receiver, although the invention is not so limited.

The term television receiver, as used herein, includes television receivers having a display screen (commonly called TV sets), and television receivers without a display screen, such as VCRs (videocassette recorders), VCPs (videocassette players), and Videodisc players. The television receiver of FIG. 1 includes Controller 100 communicating with an EEPROM 105, and other processing units (not shown) over a Communications Bus 110. Controller 100 includes a TIME of DAY CLOCK Unit 101, which could also be an external clock unit. Controller 100 receives power from a Standby Power Supply 115. Standby Power Supply 115 is well-known in the art and generates a DC supply voltage whenever it is plugged into the AC power line. The output of Standby Power Supply 115 is monitored by a Standby Power Supply Monitor 125, which applies a signal indicating the condition of Standby Power Supply 115 to the IRQ (Interrupt Request) input pin of Controller 100. A Reset circuit 120 senses the development of standby power and generates a reset signal for controller 100.

Standby Power Supply Monitor 125 is used to detect failures of the incoming AC power line. That is, if the output of Standby Power Supply 150 begins to go low in response to an AC power line failure, controller 100 receives a warning signal and responds by storing critical data for an orderly shut down of the receiver. Controller 100 has enough time to store the critical data because its own power line is held up for a short time by a storage capacitor (not shown) Resistor R1 and capacitor C1 form a timing circuit which operates as follows. During normal operation the pin labelled I/O pin is configured as an output. As such, it develops a high logic level signal to keep capacitor C1 charged. When an AC power line failure occurs, the Standby Power Supply output voltage falls to zero volts. At that time, SCR protection diode D1, internal to controller 100, begins to conduct and discharge the voltage on capacitor C1 through resistor R1. Capacitor C1 and resistor R1 have relatively high values (i.e., 100 kilohms $\leqq$R1$\leqq$1 Meg Ohm, and 10 $\mu$f$\leqq$C1$\leqq$50 $\mu$f), and preferably will maintain a high logic level for a predetermined duration of time in the range of approximately fifteen seconds to one minute.

Figure 2:
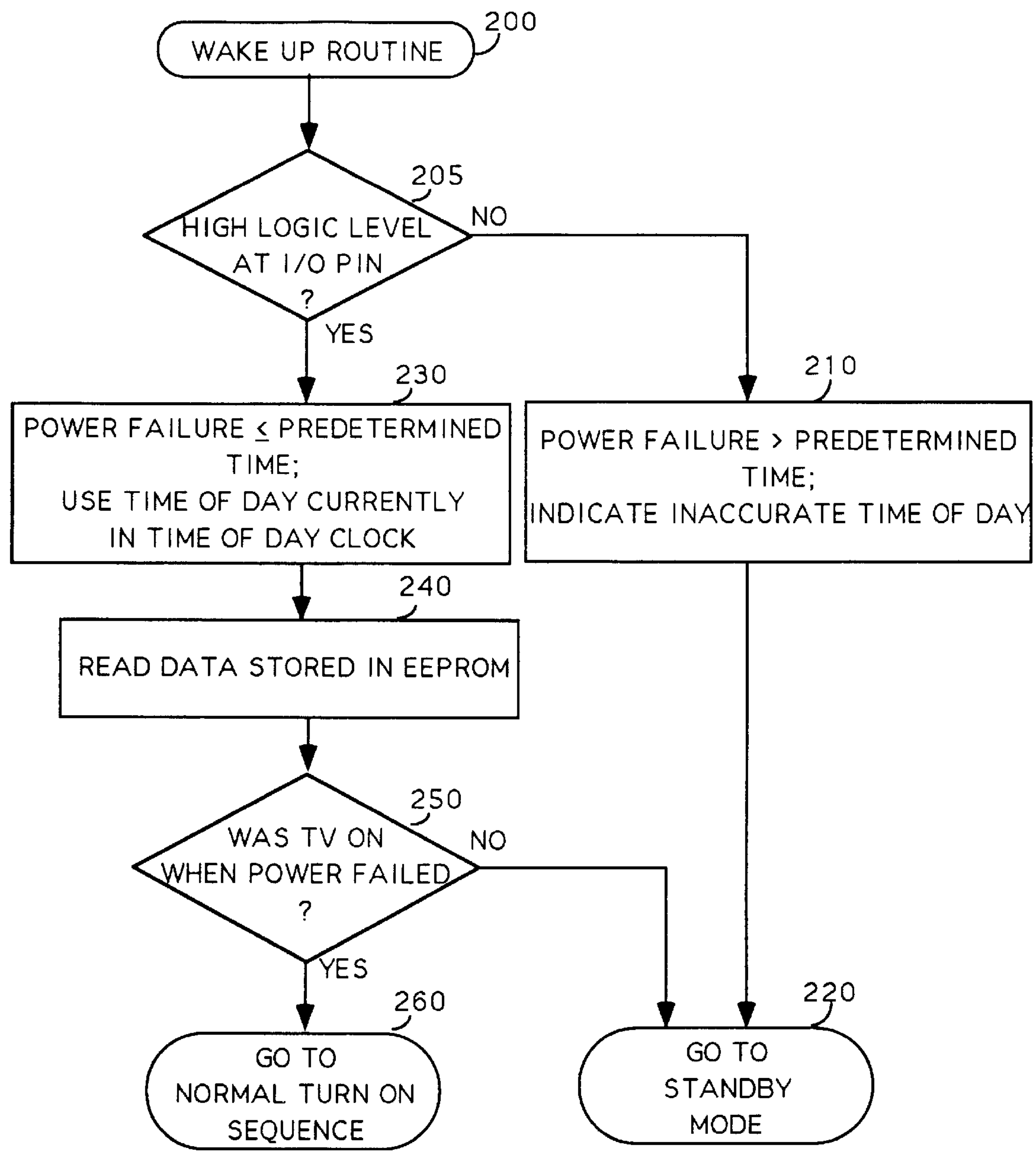
FIG. 2 shows a flowchart of a portion of the control program of FIG. 1.

FIG. 2 is a flowchart of a portion of the control program of controller 100 showing a portion of the code exercised when the controller "wakes-up" after a power failure (i.e., that portion of the code executed in response to a reset command). In response to a reset command, the routine of FIG. 2 is entered at step 200. The logic level at the I/O pin is checked at step 205 (note that after a reset function, Controller 100 configures its I/O pins to be inputs). If a low logic level appears on the I/O pin of controller 100, then the power failure is determined to be greater than the predetermined time period (i.e., a period in the range of fifteen seconds to 1 minute) and the routine is exited at step 220 wherein the receiver is maintained in the standby mode (i.e., off). If at step 205 a high logic level was read at the I/O pin of Controller 100, then the YES path is taken to step 230 where Time of Day Clock 101 is restarted using the currently held time. In this regard, it is felt that a Time of Day error of 15 seconds to 1 minute is acceptable, but any greater error should be indicated. The routine then advances to step 240 where the EEPROM is read to see if the receiver was on or off when the AC power line failure occurred. If the receiver was on, then the YES path is taken, and the routine advances to step 260 wherein power is reapplied to all devices via the normal turn on sequence. If the receiver was off at step 230, then the NO path is taken to step 220 wherein the receiver remains in standby mode. After power restoration, Controller 100 reconfigures the I/O pin back to an output pin and sets a high level at that output to recharge C1 through R1, and is again ready for the next power failure.

A dual use of the RC timer network has been described in which the elapsed time since the power failure determines the course of action which follows, both with respect to using the currently-stored time of day, and with respect to whether it is appropriate to turn on the receiver again.

In the normal course of an AC power failure, the IRQ line goes low a predetermined time before a reset is generated, due to the power hold-up capacitor (not shown). This gives controller 100 time to store the status information, such as whether the receiver was on or off, current channel, current volume setting, and time of day. In addition, a NORM/FAST bit is set (e.g. logic level 1) to indicate that what has occurred is a normal AC power outage. This bit is normally left in a reset state (e.g. logic level 0) to indicate that what has occurred is a fast reset (because during a fast reset caused by a kine arc there is no time to save any data). Thus, if controller 100 wakes up from a reset and checks the status bytes from EEPROM 105, and finds that the NORM/FAST bit is reset, then controller 100 determines that a fast reset occurred (i.e., not a power failure), and that certain procedures normally accomplished during a power up mode, such as degaussing the picture tube, need not be performed. Thus, the described system can distinguish three different kinds of resets, very short (e.g. caused by kine arcs), medium (15 seconds to 1 minute), and long (greater than 1 minute).

Instead of displaying an indication of inaccurate time when a long reset has occurred, it is also acceptable to use the currently-stored time. Thus, the clock will function in much the same way as an analog electric clock, and the viewer will be able to tell how long the power was off by checking the displayed time against the actual time.

While the timing function was accomplished using an RC network, it can also be accomplished by using timing chips, such as digital counters, and such an embodiment is intended to be within the scope of the following claims. The terms microcontroller, microprocessor, and controller, as used herein, are considered to be equivalent and interchangeable for purposes of the subject invention.

What is claimed is:

1. An electronics instrument, comprising:

a reset circuit for generating a reset signal;

control means having a first input coupled to said reset circuit for receiving said reset signal;

a time of day clock coupled to said control means for keeping time of day;

nonvolatile memory means, coupled to said control means, for storing data indicative of an operational state of said electronics instrument, said electronic instrument exhibiting one of an active operational state and an inactive operational state; and standby power supply means, coupled to said control means for supplying power to said control means; and external timing means for timing a predetermined time period during an AC power line failure;

said control means storing said data indicative of the operational state of said electronic instrument in said nonvolatile memory means;

said reset circuit causing said control means to assume a known state after an interruption of AC power;

said control means having a second input coupled to said external timing means for reading a signal of said external timing means to determine if said predetermined time period had expired;

said control means restarting said time of day clock with the currently stored time if said predetermined time period had not expired;

said control means reading said data indicative of the operational state of said electronic instrument and placing said electronic instrument in said operational state indicated by said read data if said predetermined time period had not expired, and said control means placing said electronic instrument in said inactive state if said predetermined time period had expired.

2. The electronics instrument of claim 1, wherein said external timing means is an RC circuit.

3. An electronics instrument, comprising:

a reset circuit for generating a reset signal;

control means having a first input coupled to said reset circuit for receiving said reset signal;

a time of day clock coupled to said control means for keeping time of day;

nonvolatile memory means, coupled to said control means, for storing data indicative of an operational state of said electronics instrument, said electronics instrument exhibiting one of an active operational state and an inactive operational state; and standby power supply means, coupled to said control means for supplying power to said control means; and external timing means for timing a predetermined time period during an AC power line failure;

said control means storing said data indicative of the operational state of said electronic instrument in said nonvolatile memory means;

said reset circuit causing said control means to assume a known state after an interruption of AC power;

said control means having a second input coupled to said external timing means for reading a signal of said external timing means to determine if said predetermined time period had expired;

said control means restarting said time of day clock with the currently stored time if said predetermined time period had not expired;

said control means reading said data indicative of the operational state of said electronic instrument and turning on said electronic instrument if said electronic instrument was in said active state when said AC power failure occurred, and if said predetermined time period had not expired;

wherein said predetermined time period is within a range from 15 seconds to 1 minute.

4. The electronics instrument of claim 3, wherein said external timing means is an RC circuit, said RC circuit being coupled to an output of said control means for charging a capacitor of said RC circuit through a resistor of said RC circuit:

said capacitor of said RC circuit being discharged in said predetermined time period through said output port and said resistor during said AC power line failure;

said control means, upon reactivation, reading a voltage level from said capacitor to determine if said predetermined time period has expired;

said control means further including a bidirectional port, and said second input of said control means and said output of said control means form said bidirectional port.

5. A method of processing reset conditions in a television receiver, comprising:

providing a data storage location for storing data during an orderly shut-down of said television receiver in response to an indication of an imminent power failure;

maintaining an external timer value at a predetermined value, said external timer decrementing from said predetermined value during said power failure at a predetermined rate;

reading said value of said external timer upon reacquisition of power, and selecting one of the following courses of action in response thereto;

maintaining said television receiver in a standby state if said value read from said external timer was below a predetermined value;

maintaining said television receiver in said standby state if said television receiver was in said standby state when said power failure occurred; or placing said television receiver in an active state.

* * * * *

UNITED STATES PATENT AND TRADEMARK OFFICE

CERTIFICATE OF CORRECTION

PATENT NO. : 5,831,347

DATED : November 3, 1998

INVENTOR(S) : Michael David Landis et al.

It is certified that error appears in the above-identified patent and that said Letters Patent is hereby corrected as shown below:

Column 4, line 12, "circuit" and before "3." insert -- , said RC circuit being coupled to an output pin for charging a capacitor of said RC circuit through a resistor of said RC circuit;

said capacitor of said RC circuit being discharged in said predetermined time period through said output port and said resistor during said AC power line failure;

said control means, upon reactivation, reading a voltage level from said capacitor to determine if said predetermined time period has expired. --

Signed and Sealed this

Seventh Day of December, 1999

Attest:

Q. TODD DICKINSON

*Attesting Officer*

*Acting Commissioner of Patents and Trademarks*